US008988929B2

(12) United States Patent
Park et al.

(10) Patent No.: US 8,988,929 B2
(45) Date of Patent: Mar. 24, 2015

(54) NONVOLATILE MEMORY DEVICE AND RELATED OPERATING METHOD

(71) Applicant: Samsung Electronics Co., Ltd., Suwon-si, Gyeonggi-do (KR)

(72) Inventors: Hyun-Kook Park, Anyang-si (KR); Young-Don Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/093,076

(22) Filed: Nov. 29, 2013

(65) Prior Publication Data

US 2014/0177321 A1 Jun. 26, 2014

(30) Foreign Application Priority Data

Dec. 26, 2012 (KR) ........................ 10-2012-0153269

(51) Int. Cl.
*G11C 11/00* (2006.01)
*G11C 13/00* (2006.01)

(52) U.S. Cl.
CPC ............ *G11C 13/004* (2013.01); *G11C 13/003* (2013.01); *G11C 13/0004* (2013.01); *G11C 13/0007* (2013.01); *G11C 2013/0052* (2013.01); *G11C 2213/71* (2013.01); *G11C 2213/72* (2013.01)
USPC ................... 365/148; 365/189.06; 365/189.08

(58) Field of Classification Search
CPC .. G11C 13/004; G11C 13/003; G11C 13/007; G11C 2013/0052; G11C 2013/71; G11C 2013/72; G11C 7/12; G11C 8/08

USPC .......... 365/148, 163, 189.06, 189.07, 189.08, 365/189.09, 196
See application file for complete search history.

(56) References Cited

U.S. PATENT DOCUMENTS

| 8,116,117 B2 * | 2/2012 | Cho et al. ..................... 365/148 |
| 2009/0265678 A1 | 10/2009 | Jung et al. |
| 2014/0119094 A1 * | 5/2014 | Lee et al. ..................... 365/148 |
| 2014/0119095 A1 * | 5/2014 | Lee et al. ..................... 365/148 |
| 2014/0185361 A1 * | 7/2014 | Oh et al. ..................... 365/148 |

FOREIGN PATENT DOCUMENTS

| JP | 2004296076 | 10/2004 |
| JP | 2007134032 | 5/2007 |
| JP | 2008130166 | 6/2008 |
| KR | 100843144 | 6/2008 |
| KR | 1020080066114 A | 7/2008 |
| KR | 1020080086243 A | 9/2008 |
| KR | 1020090010600 A | 1/2009 |

(Continued)

*Primary Examiner* — Gene Auduong
(74) *Attorney, Agent, or Firm* — Volentine & Whitt, PLLC

(57) ABSTRACT

A method is for driving a nonvolatile memory device, where the nonvolatile memory device includes a memory cell array composed of resistance memory cells. The method includes electrically connecting a clamping circuit, a line resistor and a selected one of the resistance memory cells in series between a sensing node and a ground. The method further includes adjusting at least one of a clamping voltage of the clamping circuit and a resistance of the line resistor according to a relative location of the selected one of the resistance memory cells within the memory cell array, and applying a read current to the sense node and sensing a voltage of the sense node to read a data stored in the selected one of the resistance memory cells.

20 Claims, 19 Drawing Sheets

(56) References Cited

FOREIGN PATENT DOCUMENTS

| KR | 1020100020265 A | 2/2010 |
|----|----|----|
| KR | 1020100054417 A | 5/2010 |
| KR | 1020100116725 A | 11/2010 |
| KR | 1020110025700 | 3/2011 |
| KR | 1020110044535 A | 4/2011 |
| KR | 101038992 | 5/2011 |
| KR | 1020110046808 A | 5/2011 |
| KR | 101047051 | 6/2011 |
| KR | 1020120087721 A | 8/2012 |

* cited by examiner

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

| SA/WD(2_1) | SA/WD(2_2) | SA/WD(2_3) | SA/WD(2_4) |
|---|---|---|---|

| PERIPHERY(3) |
|---|

| SA/WD(2_8) | SA/WD(2_7) | SA/WD(2_6) | SA/WD(2_5) |
|---|---|---|---|

| | | | | | | | | |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

NONVOLATILE MEMORY DEVICE AND RELATED OPERATING METHOD

CROSS-REFERENCE TO RELATED APPLICATIONS

A claim of priority is made to Korean Patent Application No. 10-2012-0153269, filed on Dec. 26, 2012, in the Korean Intellectual Property Office, the disclosure of which is incorporated herein in its entirety by reference.

BACKGROUND

The inventive concept relates to semiconductor memories, and more particularly, the inventive concept relates to nonvolatile memory devices using a resistance material to store data, and to methods for driving nonvolatile memory devices using a resistance material to store data.

A memory cell of a nonvolatile memory device may utilize a material having a programmable and variable resistance characteristic (referred to herein simply as a "resistance material") to store data. Examples of such devices include a phase change random access memory (PRAM), a resistive RAM (RRAM), a magnetic RAM (MRAM), among others. The mechanisms for setting a cell resistance vary among these types of device, but each is characterized by programming the cell resistance to represent (store) one or more bits of data.

For example, the PRAM utilizes the selective application of thermal energy to set (or reset) a phase change material thereof to a (relatively) crystal state or a (relatively) amorphous state. The phase change material in the crystal state has a lower resistance than that of the amorphous state has high resistance. Thus, stored data can be discriminated by determining a relative resistance of the memory cell. For example, the crystal state may be designated as set data or 0 data, and the amorphous state may be designated as reset data or 1 data.

SUMMARY

According to an aspect of embodiments of the inventive concept, a method for driving a nonvolatile memory device is provided which includes determining a read voltage of a nonvolatile memory cell, the read voltage being determined such that a resultant sensing margin is equal to or higher than a predetermined level, and adjusting at least one of clamping voltage and a line resistor connected to the nonvolatile memory cell so that the determined read voltage is applied to the nonvolatile memory cell when reading a data stored in the nonvolatile memory cell.

According to another aspect of embodiments of the inventive concept, a method for driving a nonvolatile memory device is provided, where the nonvolatile memory device includes a memory cell array composed of resistance memory cells. The method includes electrically connecting a clamping circuit, a line resistor and a selected one of the resistance memory cells in series between a sensing node and a ground. The method further includes adjusting at least one of a clamping voltage of the clamping circuit and a resistance of the line resistor according to a relative location of the selected one of the resistance memory cells within the memory cell array, and applying a read current to the sense node and sensing a voltage of the sense node to read a data stored in the selected one of the resistance memory cells.

According to still another aspect of embodiments of the inventive concept, a nonvolatile memory device is provided which includes a resistance memory cell, a current source providing a compensation current to a first sensing node, a sense amplifier connected to the first sensing node to sense a level change of the first sensing node, a clamping unit connected between the resistance memory cell and the first sensing node to receive a control voltage and to output a clamping voltage, and a line resistor located between the clamping unit and the resistance memory cell and between the resistance memory cell and a ground terminal. At least one of the clamping voltage and the line resistor is adjustable so that a read voltage is obtained that results in a sensing margin that is equal to or higher than a predetermined level when reading a data stored in the resistance memory cell.

BRIEF DESCRIPTION OF THE DRAWINGS

The above and other aspects and features of the inventive concept will be readily apparent from the detailed description that follows, with reference to the accompanying drawings, in which:

FIG. 1 is a block diagram illustrating a layout of a nonvolatile memory device according to some embodiments of the inventive concept;

DETAILED DESCRIPTION OF THE EMBODIMENTS

Figure 2:
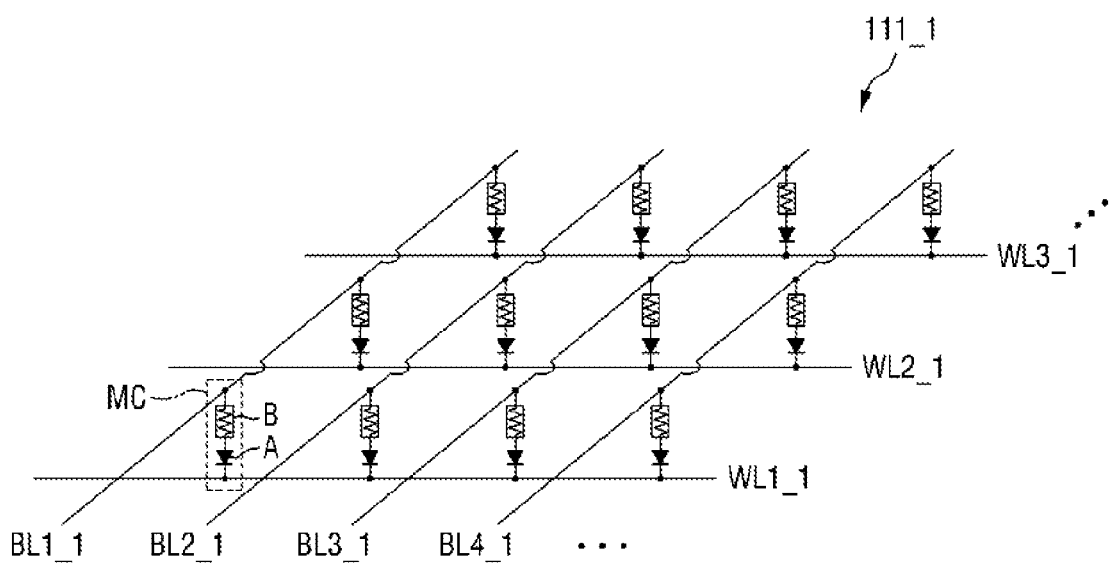
FIGS. 2 and 3 are views for reference in explaining aspects of a memory cell array of FIG. 1.

Advantages and features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, embodiments of the inventive concept will be described using a phase change random access memory (PRAM) as an example. However, it will be apparent to those skilled in the art that the inventive concept can be applied to other nonvolatile memory devices using a resistance material, such as, for example, a resistive RAM (RRAM) and a magnetic RAM (MRAM).

FIG. 1 is a block diagram explaining a nonvolatile memory device according to some embodiments of the inventive concept. In FIG. 1, for convenience in explanation, a nonvolatile memory device composed of 16 memory banks is exemplified, but the inventive concept is not limited to any particular number of memory banks.

Referring to FIG. 1, a nonvolatile memory device according to embodiments of the inventive concept includes a memory cell array, a plurality of sense amplifiers and write drivers 2_1 to 2_8, and a peripheral circuit region 3.

The memory cell array may include a plurality of memory banks 1_1 to 1_16, and each of the memory banks 1_1 to 1_16 may include a plurality of memory blocks BLK0 to BLK7. Each of the memory blocks BLK0 to BLK7 may include a plurality of nonvolatile memory cells which are arranged in a matrix form. In FIG. 1, an example is presented in which the memory blocks are arranged 8 by 8 on each side of the peripheral circuit region 3, but the inventive concept is not limited to such an arrangement.

Further, it will be understood that circuits not illustrated in FIG. 1 may also be present. For example, a row selection circuit and a column selection circuit may be provided to designate (select) rows and columns of resistance memory cells to be written/read among the memory banks 1_1 to 1_16.

The sense amplifiers and write drivers 2_1 to 2_8 are arranged to correspond to two memory banks 1_1 to 1_16, and perform read and write operations in the corresponding memory banks. In the embodiments of the inventive concept, it is exemplified that the sense amplifiers and write drivers 2_1 to 2_8 correspond to two memory banks 1_1 to 1_16, but the inventive concept is not limited thereto. As examples, the sense amplifiers and write drivers 2_1 to 2_8 may be arranged to correspond to one or four memory banks.

In the peripheral circuit region 3, a plurality of logic circuit blocks for operating the column selection circuit, the row selection circuit, the sense amplifiers and write drivers 2_1 to 2_8 and a voltage generator may be arranged.

Figure 3:
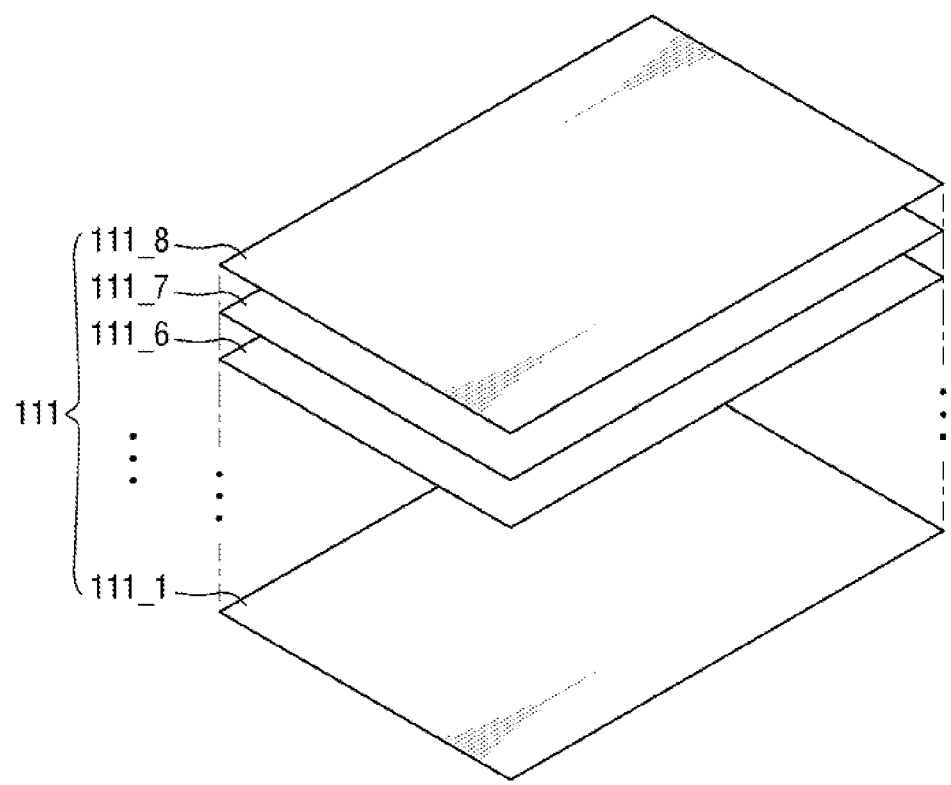

FIGS. 2 and 3 are views for reference in further explaining the memory cell array of FIG. 1.

Referring to FIG. 2, the memory cell array may have a cross point structure. Here, the cross point structure refers to a structure in which one memory cell is formed in a region where one line and another line cross each other. For example, bit lines BL1_1 to BL4_1 may be formed to extend in a first direction, word lines WL1_1 to WL3_1 may be formed to extend in a second direction so that the word lines cross the bit lines BL1_1 to BL4_1, and resistance memory cells MC may be formed in regions where the bit lines BL1_1 to BL4_1 and the word lines WL1_1 to WL3_1 cross each other. Each of the resistance memory cells MC may include a variable resistance element B and an access element A that controls current flowing to the variable resistance element B.

Further, as illustrated in FIG. 3, the memory cell array may have a three-dimensional (3D) laminated structure. Here, the 3D laminated structure refers to a structure in which a plurality of memory cell layers 111_1 to 111_8 is vertically laminated. In FIG. 3, an example is illustrated in which 8 memory cell layers 111_1 to 111_8 are laminated, but the inventive concept is not limited thereto. Here, the respective memory cell layers 111_1 to 111_8 may include a plurality of memory cell groups and/or a plurality of redundancy memory cell groups. In the case where the memory cell array has a 3D laminated structure, the respective memory cell layers 111_1 to 111_8 may have the cross point structure as illustrated in FIG. 2, but the inventive concept is not limited thereto.

Figure 4:
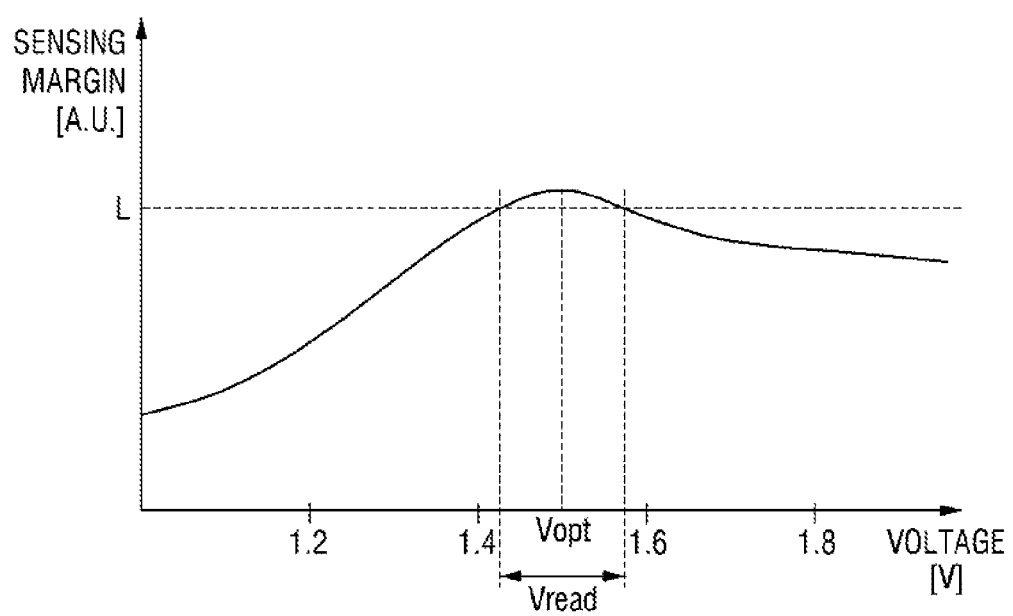
FIG. 4 is a graph illustrating an example of a change in a sensing margin of a nonvolatile memory cell relative to an applied voltage.

FIG. 4 is a graph illustrating a sensing margins of nonvolatile memory cells relative to an applied voltage.

Referring to FIG. 4, the respective resistance memory cells (MC in FIG. 2) may have different sensing margins depending on an applied voltage. Here, the sensing margin is an index indicating how well 0 data and 1 data, which are stored in the resistance memory cells, can be distinguished from each other.

For example, in the case where a read voltage Vread is applied to the resistance memory cells (MC in FIG. 2), 0 data and 1 data, which are stored in the resistance memory cells (MC in FIG. 2), can be read with a sensing margin that is equal to or higher than a predetermined level L. In particular, if the minimum voltage Vopt of the read voltage Vread is applied to the resistance memory cells (MC in FIG. 2), 0 data and 1 data, which are stored in the resistance memory cells (MC in FIG. 2), can be read with a sensing margin at a maximum level.

Figure 5:
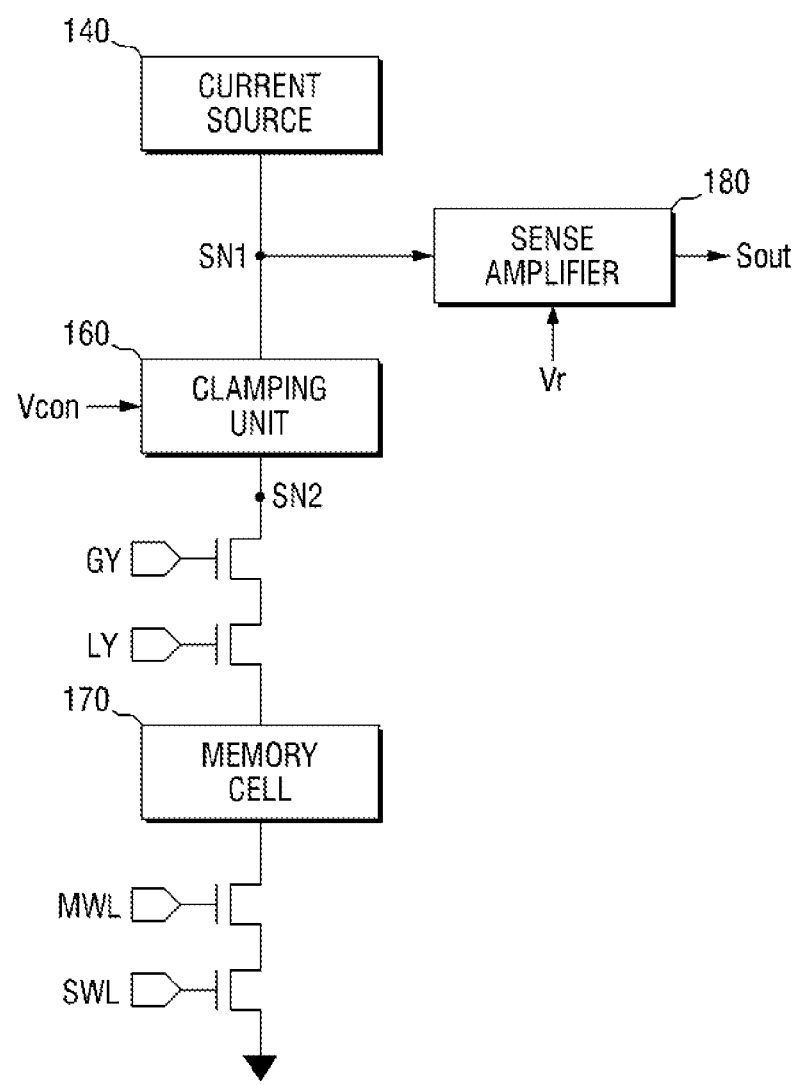
FIG. 5 is a block diagram for reference in explaining a nonvolatile memory device according to embodiments of the inventive concept.
Figure 6:
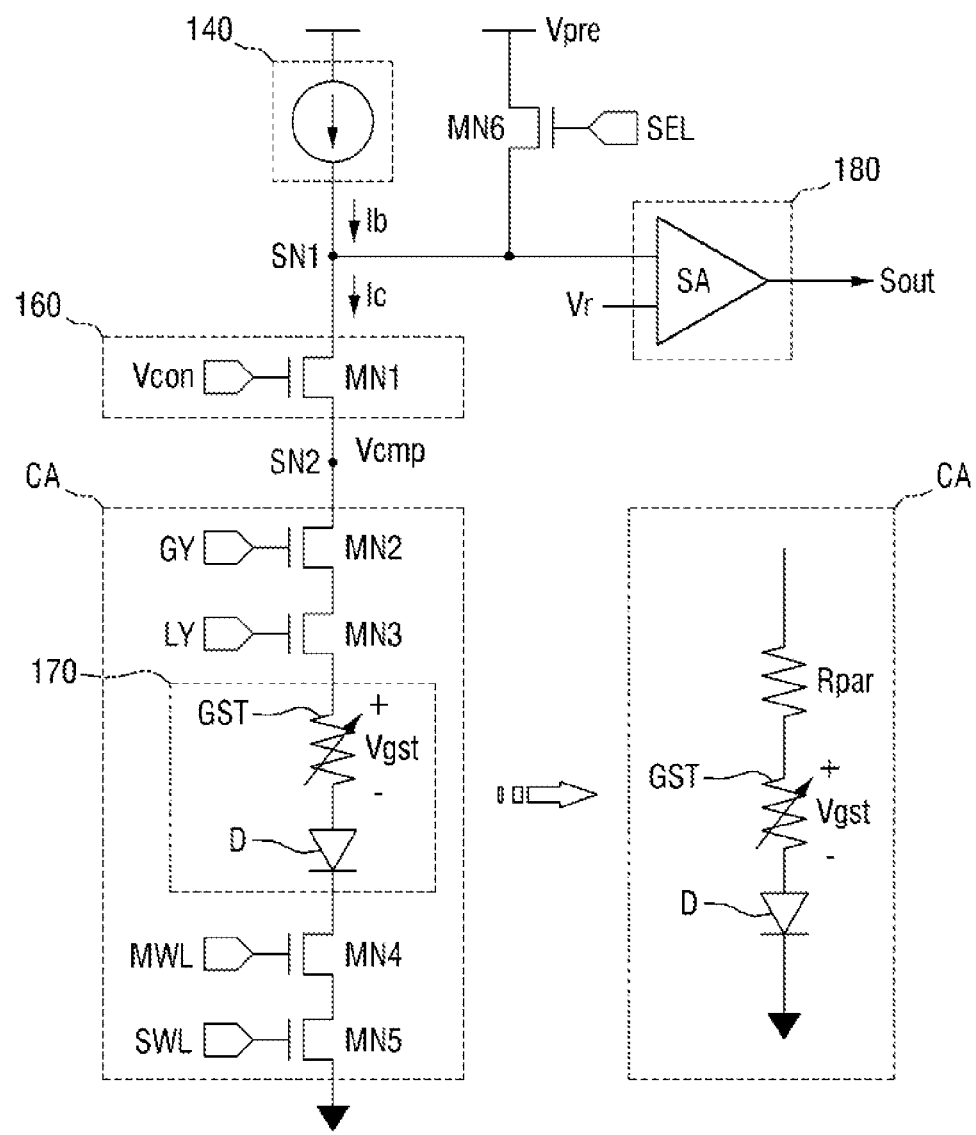
FIG. 6 is an exemplary circuit diagram of the nonvolatile memory device of FIG. 5.

FIG. 5 is a block diagram for reference explaining a nonvolatile memory device according to an embodiment of the inventive concept, and FIG. 6 is an exemplary circuit diagram of the nonvolatile memory device of FIG. 5.

Referring to FIGS. 5 and 6, a nonvolatile memory device according to an embodiment of the inventive concept may include a current source 140, a first sensing node SN1, a clamping unit 160, a sense amplifier 180, a second sensing node SN2, and a resistance memory cell 170.

The illustrated resistance memory cell 170 is a resistance memory cell which is selected to be read among a plurality of resistance memory cells in the memory cell array. Here, if the resistance memory cell 170 is a PRAM cell, the resistance memory cell 170 may include a variable resistance element GST having a phase change material and an access element D controlling current that flows to the variable resistance element GST. Here, the access element D may be a diode or a transistor that is connected in series to the variable resistance element GST.

A variety of different phase change materials may be used, such as GaSb, InSb, InSe, $Sb_2Te_3$, and GeTe, in which two elements are combined, GeSbTe, GaSeTe, InSbTe, SnSb2Te4, and InSbGe, in which three elements are combined, and AgInSbTe, (GeSn)SbTe, GeSb(SeTe), and $Te_{81}Ge_{15}Sb_2S_2$, in which four elements are combined. Among these, GeSbTe, which is composed of germanium (Ge), antimony (Sb), and tellurium (Te), is the most commonly utilized material.

On the other hand, if the resistance memory cell 170 is an RRAM cell, the variable resistance element may include, for example, NiO or perovskite. The perovskite may be a composition, such as manganite ($Pr_{0.7}Ca_{0.3}MnO_3$, $Pr_{0.5}Ca_{0.5}MnO_3$, other PCMO, LCMO, and the like), titernate (STO:Cr), and zirconate (SZO:Cr, $Ca_2Nb_2O_7$:Cr, and $Ta_2O_5$:Cr). A filament may be formed in the variable resistance element GST, and the filament becomes a current path of cell current Ic that penetratingly flows through the resistance memory cell 170.

The current source 140 may provide compensation current Ib to the first sensing node SN1. Specifically, the current source 140 may provide the compensation current Ib to the first sensing node SN1 in order to compensate for the level decrease of the first sensing node SN1 which occurs due the cell current Ic that penetratingly flows through the selected resistance memory cell 170. The current source 140 may include a PMOS transistor connected between the power supply voltage and the first sensing node SN1, a PMOS transistor connected between the power supply voltage and the ground voltage, and a source. Here, the two PMOS transistors may have gates connected to each other and may be of a current mirror type, but the inventive concept is not limited thereto.

The clamping unit 160 is connected between the resistance memory cell 170 and the first sensing node SN1 to clamp the level of the bit line, on which the first sensing node SN1 and the second sensing node SN2 are arranged, within an appropriate readable range. Specifically, the clamping unit 160 clamps the bit line level to a predetermined level that is equal to or lower than a threshold voltage Vth_gst of the phase change material. This is because if the bit line level becomes higher than the threshold voltage Vth_gst, the phase change material of the selected resistance memory cell 170 may be changed. As illustrated in FIG. 6, the clamping unit 160 may include a first NMOS transistor MN1 which serves as a clamping transistor that receives an externally supplied control voltage Vcon and outputs a clamping voltage Vcmp to the second sensing node SN2.

In the nonvolatile memory device according to some embodiments of the inventive concept, the clamping voltage Vcmp that the clamping unit 160 outputs may be a voltage that is obtained by subtracting the threshold voltage Vth_mn1 of the first NMOS transistor NM1 from the control voltage Vcon. That is, the clamping voltage Vcmp that is applied to the second sensing node SN2 may be expressed by the following equation (1).

$$Vcmp = Vcon - Vth\_mn1 \quad (1)$$

On the other hand, the clamping voltage Vcmp applied to the bit line is divided by a parasitic resistor Rpar that exists in the cell region CA and a resistor of the resistance memory cell 170. Specifically, in the cell region CA of the bit line, as illustrated, second and third NMOS transistors MN2 and MN3 that are used as bit line selection transistors and fourth and fifth NMOS transistors MN4 and MN5 that are used as word line selection transistors may exist. Here, the second NMOS transistor MN2 may be gated, for example, by a global bit line signal GY, the third NMOS transistor MN3 may be gated, for example, by a local bit line signal LY, the fourth NMOS transistor MN4 may be gated, for example, by a main word line signal MWL, and the fifth NMOS transistor MN5 may be gated, for example, by a sub-word line signal SWL.

The second to fifth NMOS transistors MN2 to MN5 serve as the parasitic resistor Rpar that drops the clamping voltage Vcmp applied to the bit line. That is, the voltage Vgst applied to the resistance memory cell 170 becomes the voltage that is obtained by dropping the clamping voltage Vcmp by the parasitic resistor Rpar. That is, the voltage Vgst applied to the resistance memory cell 170 is expressed by the following equation (2).

$$Vgst = Rgst/(Rgst+Rpar)*Vcmp = Rgst/(Rgst+Rpar)*(Vcon-Vth\_mn1) \quad (2)$$

On the other hand, the sense amplifier 180 is connected to the first sensing node SN1 to sense the level change of the first sensing node SN1. Specifically, the sense amplifier 180 compares the level of the first sensing node SN1 with a reference level Vr and outputs the result of the comparison. The sense amplifier 180 may be a current sense amplifier or a voltage sense amplifier.

As described above, since during a read period, the compensation current Ib is constant and the value of the cell current Ic is changed depending on the resistor of the resistance memory cell 170, the level of the first sensing node SN1 is changed depending on the resistor of the resistance memory cell 170. Accordingly, by reading the output of the sense amplifier 180, data stored in the resistance memory cell 170 can be read.

In the nonvolatile memory device according to some embodiments of the inventive concept, a keeper transistor for keeping the first sensing node SN1 with a level of pre-voltage Vpre for a predetermined time before the sense amplifier 180 is enabled may be provided between the first sensing node SN1 and the sense amplifier 180. This keeper transistor is shown by example in FIG. 8 (described next) as a sixth NMOS transistor MN6 that is gated by a selection signal SEL, but the inventive concept is not limited thereto.

Figure 7:
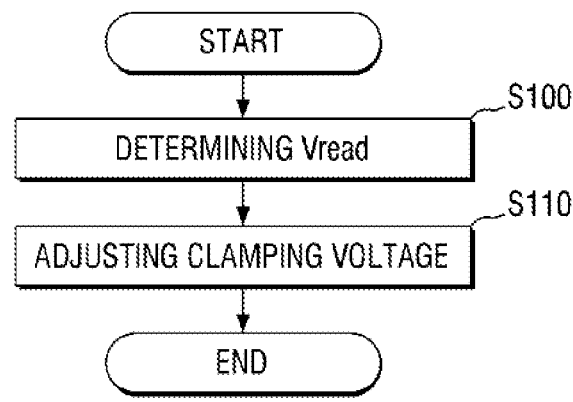
FIG. 7 is a flowchart illustrating a method for driving a nonvolatile memory device according to an embodiment of the inventive concept.
Figure 8:
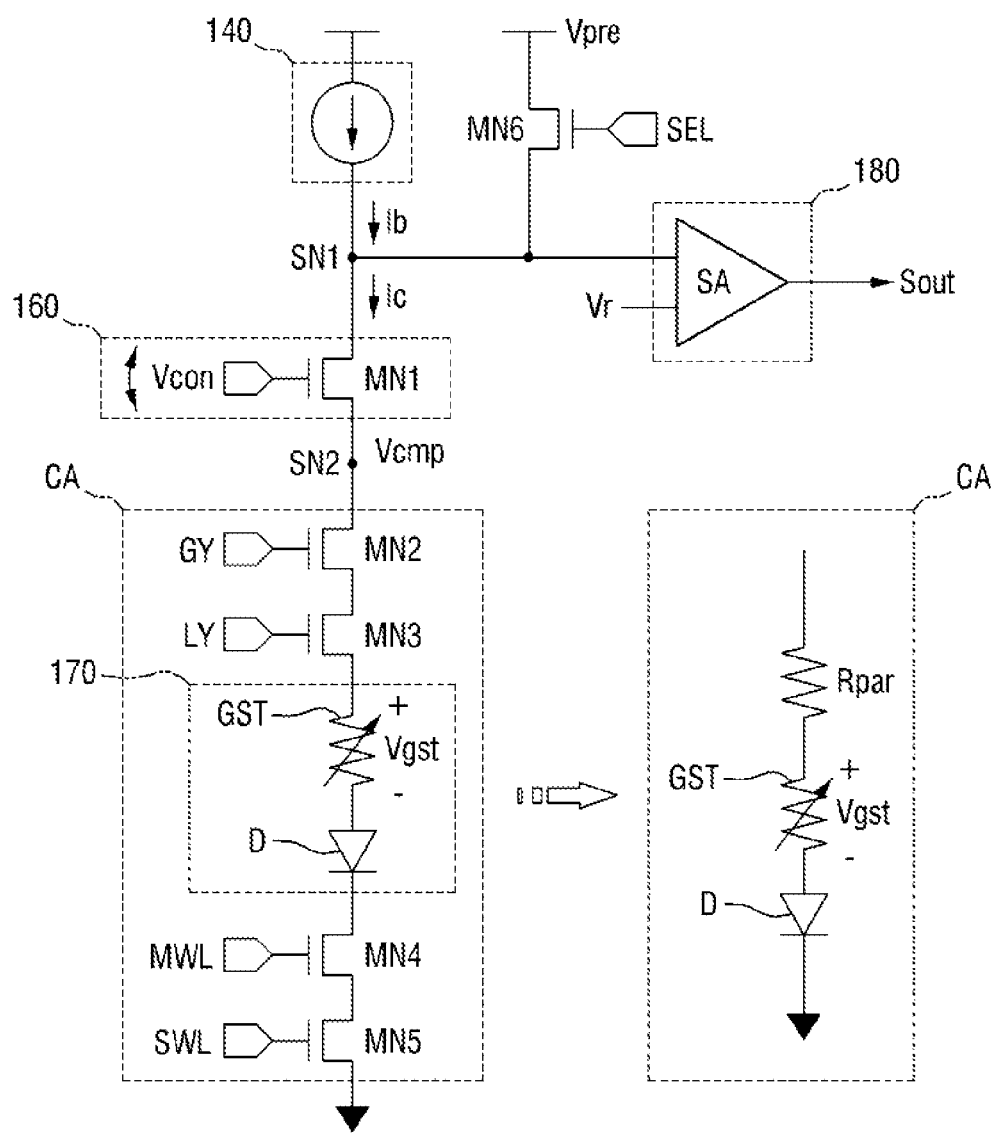
FIGS. 8 and 9 are diagrams for reference in explaining a method for adjusting a clamping voltage in FIG. 7.
Figure 9:
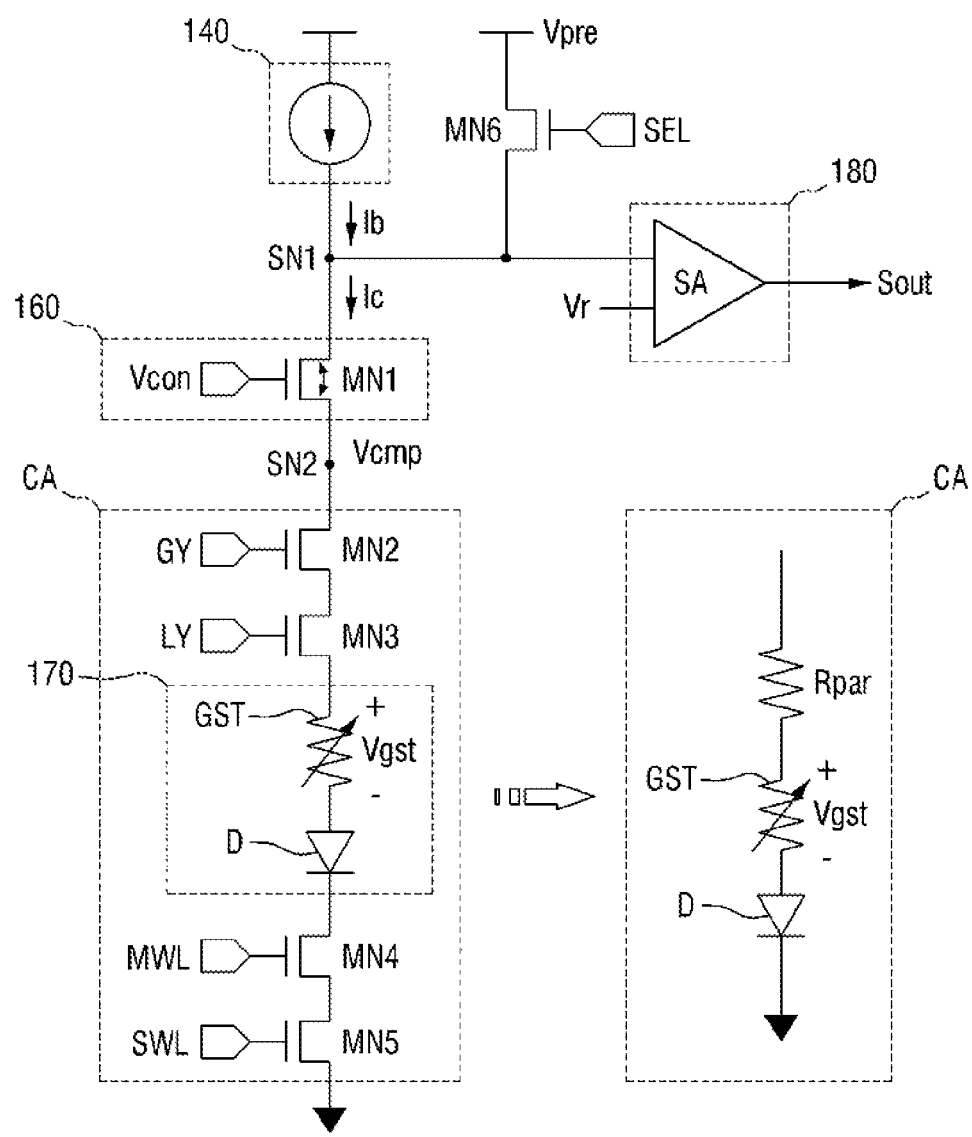

FIG. 7 is a flowchart for reference in describing a method for driving a nonvolatile memory device according to an embodiment of the inventive concept. FIGS. 8 and 9 are diagrams explaining a method for adjusting a clamping voltage in FIG. 7.

First, referring to FIGS. 7 and 8, during a read period of the nonvolatile memory device, the read voltage Vread to be applied to the resistance memory cell 170 is determined (S100). Here, as illustrated in FIG. 4, the read voltage Vread may be determined as the voltage that can secure the sensing margin of a predetermined level L. Particularly, in some embodiments of the inventive concept, the read voltage Vread may be the optimum voltage Vopt that can maximize the sensing margin.

Next, when reading the data stored in the resistance memory cell 170, the clamping voltage Vcmp is adjusted so that the determined read voltage Vread is applied to the resistance memory cell 170 (S110).

As one method for adjusting the clamping voltage Vcmp, for example, as represented by the curved double-arrow shown in FIG. 8, the level of the control voltage Vcon that is applied to the clamping transistor MN1 may be adjusted in accordance with the position of the resistance memory cell 170. Once the control voltage Vcon is adjusted, the clamping voltage Vcmp can be adjusted through the above-described equation (1).

As expressed in the equation (2), the voltage Vgst applied to the resistance memory cell 170 is changed in accordance with the value of the parasitic resistor Rpar. Since the value of the parasitic resistor Rpar is changed according to the position of the resistance memory cell 170, in consideration of this in this embodiment, the level of the control voltage Vcon applied to the clamping transistor MN1 can be adjusted in accordance with the position of the resistance memory cell 170.

For example, the value of the parasitic resistor Rpar of the resistance memory cell 170 that is arranged close to the clamping transistor MN1 would be smaller than the value of the parasitic resistor Rpar of the resistance memory cell 170 that is arranged further away from the clamping transistor MN1. Accordingly, for example, in order to apply the equal optimum voltage (Vopt in FIG. 4) to the resistance memory cell 170 regardless of its position when reading the data stored in the resistance memory cell 170, it is necessary to apply a higher control voltage Vcon in the case where the resistance memory cell 170 is arranged far from the clamping transistor MN1 rather than in the case where the resistance memory cell 170 is arranged close to the clamping transistor MN1. This is because the parasitic resistor Rpar in the case where the resistance memory cell 170 is arranged far from the clamping transistor MN1 would be higher than the parasitic resistor Rpar in the case where the resistance memory cell 170 is arranged close to the clamping transistor MN1.

As described above, if the equal optimum voltage (Vopt in FIG. 4) is applied to the resistance memory cell 170 regardless of its position when reading the data stored in the resistance memory cell 170, a favorable sensing margin such as the maximum sensing margin of FIG. 4 can be secured. Accordingly, the read reliability of the nonvolatile memory device can be improved.

On the other hand, the control voltage Vcon that is differently adjusted in accordance with the position of the resistance memory cell 170 may be developed before the keeper transistor MN6 is turned off. In other words, while the selection signal SEL is applied and the keeper transistor MN6 is turned on, the level of the control voltage Vcon may be determined in accordance with the position of the resistance memory cell 170. Since the control voltage Vcon is developed while the keeper transistor MN6 is turned on, the operational reliability of the sense amplifier 180 can be secured.

On the other hand, the method for adjusting the clamping voltage Vcmp is not limited thereto. As another example, as illustrated in FIG. 9, the clamping voltage Vcmp can be adjusted by adjusting the size of the clamping transistor MN1 or a body bias that is applied to the clamping transistor MN1 in accordance with the position of the resistance memory cell 170.

Specifically, as expressed in the equation (1), since the clamping voltage Vcmp applied to the second sensing node SN2 is the voltage obtained by subtracting the threshold voltage Vth_mn1 of the clamping transistor MN1 from the control voltage Vcon, the clamping voltage Vcmp may be adjusted by applying the control voltage Vcon of a predetermined level to the clamping transistor MN1 and adjusting the threshold voltage Vth_mn1 of the clamping transistor MN1 through adjustment of the size of the clamping transistor MN1 or the body bias applied to the clamping transistor MN1.

Figure 10:
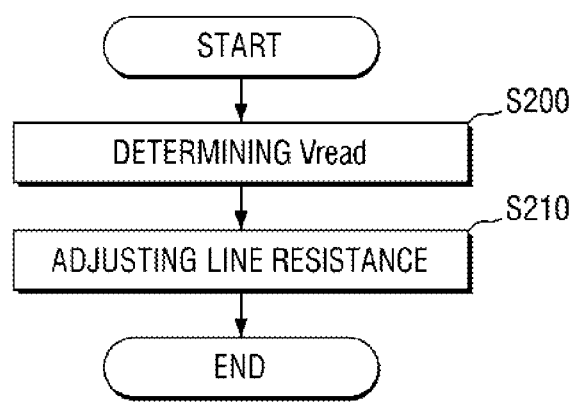
FIG. 10 is a flowchart illustrating a method for driving a nonvolatile memory device according to another embodiment of the inventive concept.
Figure 11:
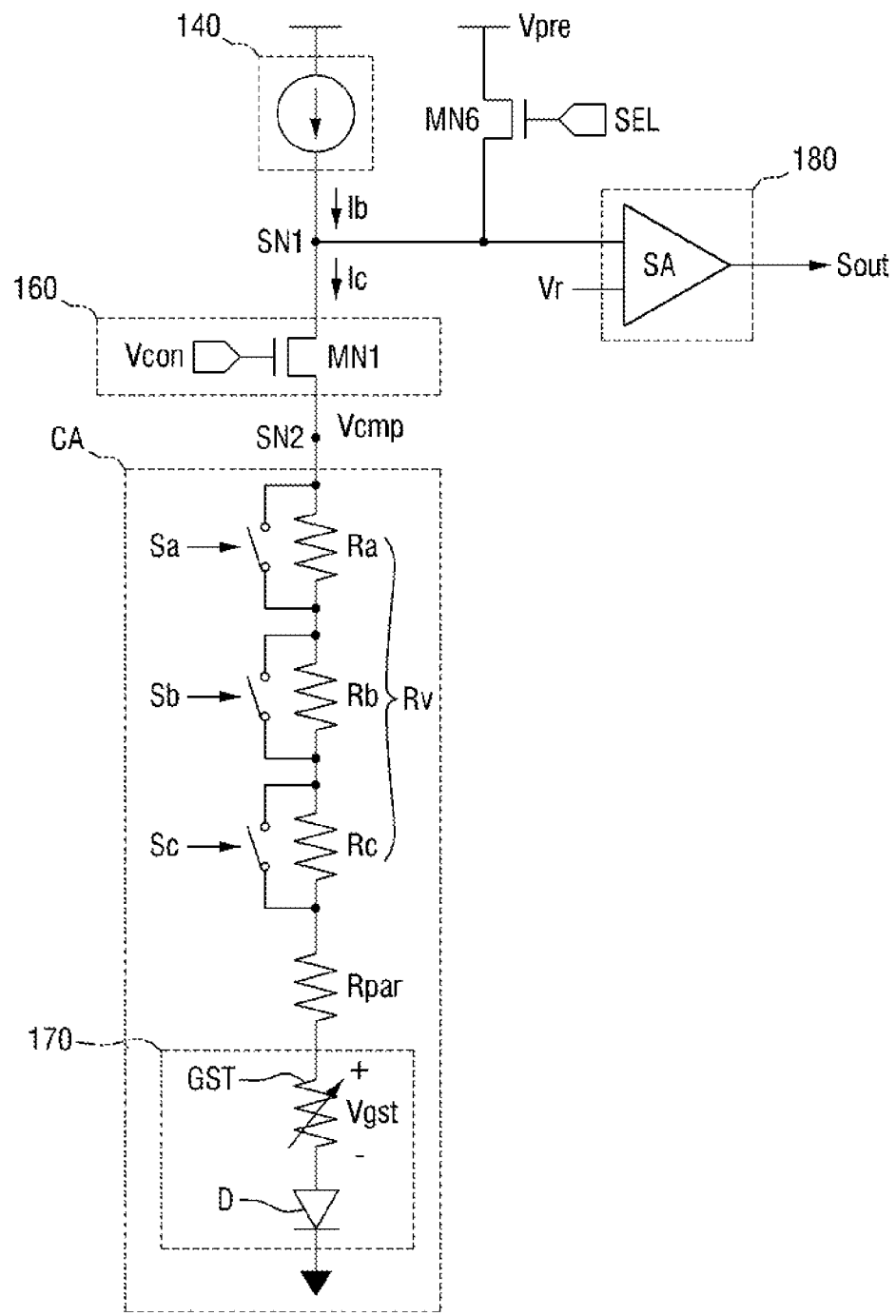
FIGS. 11 and 12 are diagrams for reference in explaining a method for adjusting a line resistor in FIG. 10.
Figure 12:
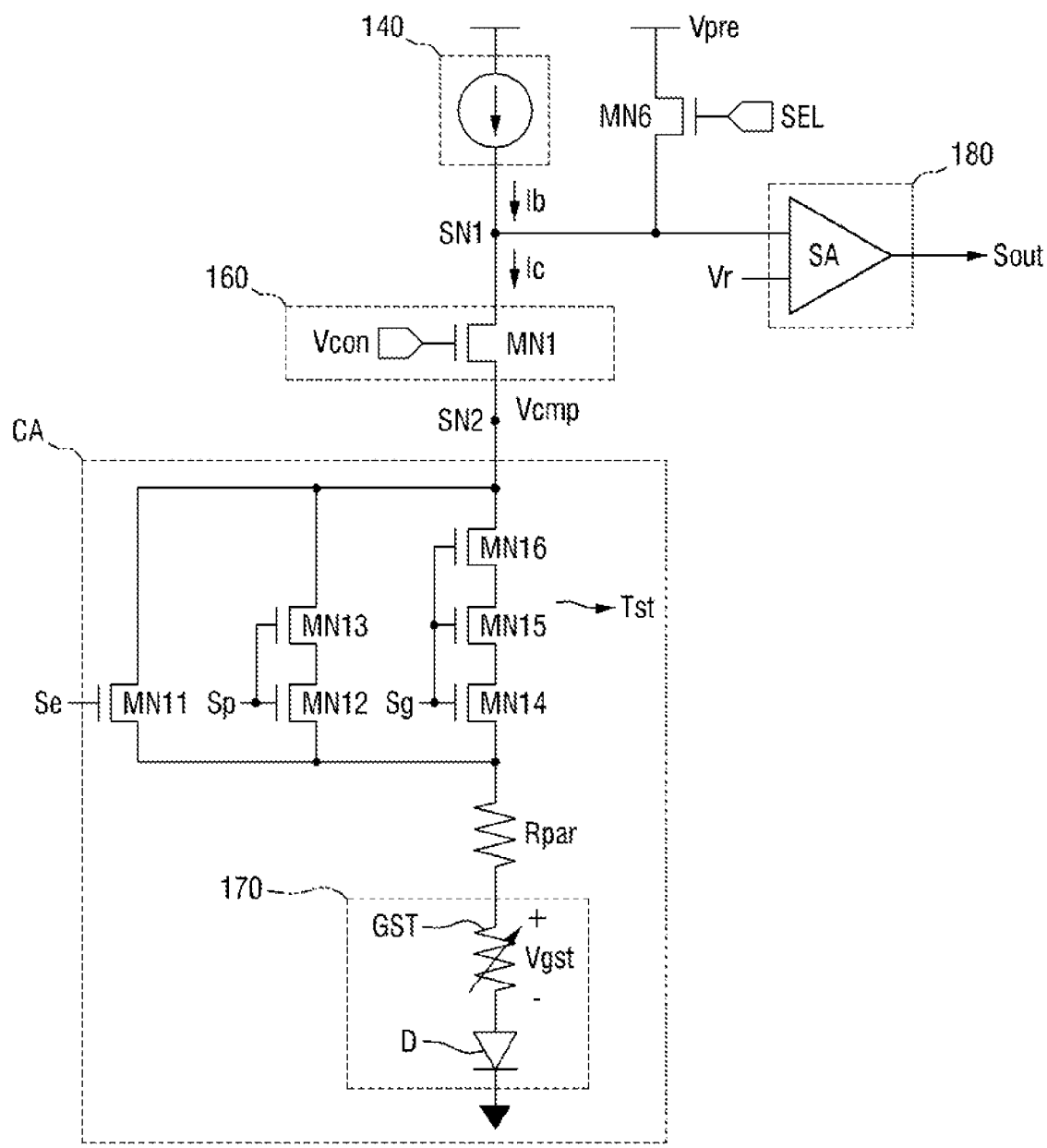

FIG. 10 is a flowchart illustrating a method for driving a nonvolatile memory device according to another embodiment of the inventive concept. FIGS. 11 and 12 are diagrams explaining a method for adjusting a line resistor in FIG. 10.

First, referring to FIG. 10, during a read period of the nonvolatile memory device, the read voltage Vread to be applied to the resistance memory cell 170 is determined (S200). Here, as illustrated in FIG. 4, the read voltage Vread may be determined as the voltage that can secure the sensing margin of a predetermined level L. Further, in some embodiments of the inventive concept, the read voltage Vread may be the optimum voltage Vopt that maximizes the sensing margin.

Next, referring to FIG. 10, when reading the data stored in the resistance memory cell 170, the line resistor is adjusted so that the determined read voltage Vread is applied to the resistance memory cell 170 (S210).

Here, the line resistor may mean the resistor that exists between the clamping unit 160 and the resistance memory cell 170 and between the resistance memory cell 170 and the ground terminal. One example of the line resistor may be the parasitic resistor Rpar having different values in accordance with the position of the resistance memory cell 170 as described above.

As one method for adjusting the line resistor, for example, as illustrated in FIG. 11, a method for adding a variable resistor Rv as the line resistor. In this case, the line resistor includes the variable resistor Rv and the parasitic resistor Rpar, and by compensating for the resistance value of the parasitic resistor Rpar, which is changed in accordance with the position of the resistance memory cell 170, the read voltage Vread as determined above can be applied to the resistance memory cell 170 during the read operation of the nonvolatile memory device.

FIG. 11 illustrates an example of the variable resistor Rv. In this example, switches which are turned on/off in accordance with first to third signals Sa, Sb, and Sc that have different values in accordance with the position of the resistance memory cell 170, and the variable resistor Rv including first to third resistors Ra, Rb, and Rc are provided. However, the inventive concept is not limited thereto, and the configuration of the variable resistor Rv may be modified in a wide variety of different ways.

On the other hand, another method for adjusting the line resistor may be, for example, as illustrated in FIG. 12, a method for adding a transistor stack Tst as the line resistor. In this case, the line resistor includes the resistor by the transistors MN11 to MN16 which are turned on at the transistor stack Tst and the parasitic resistor Rpar, and by compensating for the resistance value of the parasitic resistor Rpar, which is changed in accordance with the position of the resistance memory cell 170 through turning on the transistors MN11 to MN16 included in the transistor stack Tst, the read voltage Vread as determined above can be applied to the resistance memory cell 170 during the read operation of the nonvolatile memory device.

FIG. 12 illustrates an example of the transistor stack Tst. For example, if the resistance memory cell 170 is arranged close to the clamping transistor MN1, the level of the parasitic resistor Rpar is relatively low, and thus the level of the line resistor is increased through turning on three transistors MN14 to MN16 included in the transistor stack Tst. Further, if the resistance memory cell 170 is arranged far apart from the clamping transistor MN1, the level of the parasitic resistor Rpar is relatively high, and thus the line resistor is decreased through turning on only one transistor MN11 included in the transistor stack Tst. Accordingly, the read voltage Vread as determined above can be applied to the resistance memory cell 170.

Although FIG. 12 illustrates 6 NMOS transistors MN11 to MN 16 which are turned on/off depending on fourth to sixth signals Se, Sp, and Sg having different values in accordance with the position of the resistance memory cell 170 as an example of the transistor stack Tst, the inventive concept is not limited thereto. The configuration of the transistor stack Tst may be modified in a variety of different ways.

FIGS. 13 through 25 are diagrams illustrating a variety of different types of memory systems to utilized one or more embodiments of the inventive concept described above. That is, each of these memory systems that includes a nonvolatile memory device according to one or more embodiments of the inventive concept.

Figure 13:
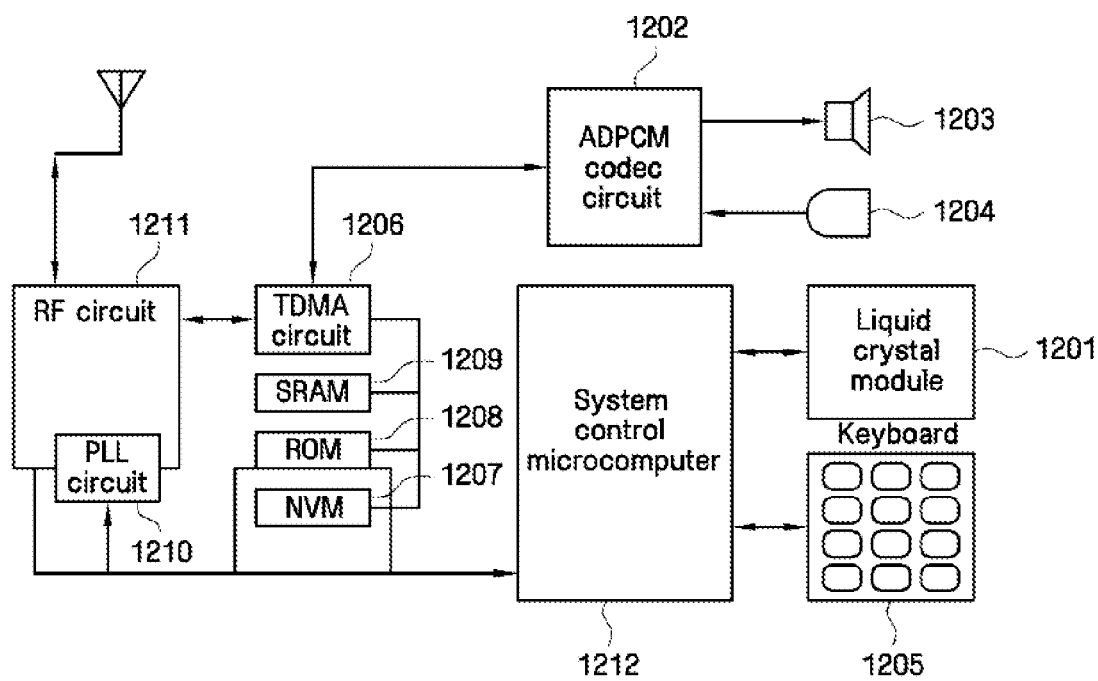
FIGS. 13, 14, 15, 16, 17, 18, 19, 20, 21, 22, 23, 24 and 25 illustrate a variety of memory systems according to embodiments of the inventive concept.

FIG. 13 is an exemplary diagram of a cellular phone system using a nonvolatile memory device according to the embodiments of the inventive concept.

Referring to FIG. 13, the cellular phone system includes a compression or decompression ADPCM codec circuit 1202, a speaker 1203, a microphone 1204, a TDMA circuit 1206 for time-division-multiplexing digital data, a PLL circuit 1210 setting a carrier frequency of a wireless signal, and an RF circuit 1211 for transferring or receiving the wireless signal.

Further, the cellular phone system may include various kinds of memory devices, and for example, may include a nonvolatile memory device 1207, a ROM 1208, and an SRAM 1209. The nonvolatile memory device 1207 may be the nonvolatile memory device according to the embodiments of the inventive concept, and may store, for example, ID numbers. The ROM 1208 may store programs, and the SRAM 1209 may serve as a workspace for a system control microcomputer 1212 or may temporarily store data. Here, the system control microcomputer 1212 may be a processor which can control write and read operations of the nonvolatile memory device 1207.

Figure 14:
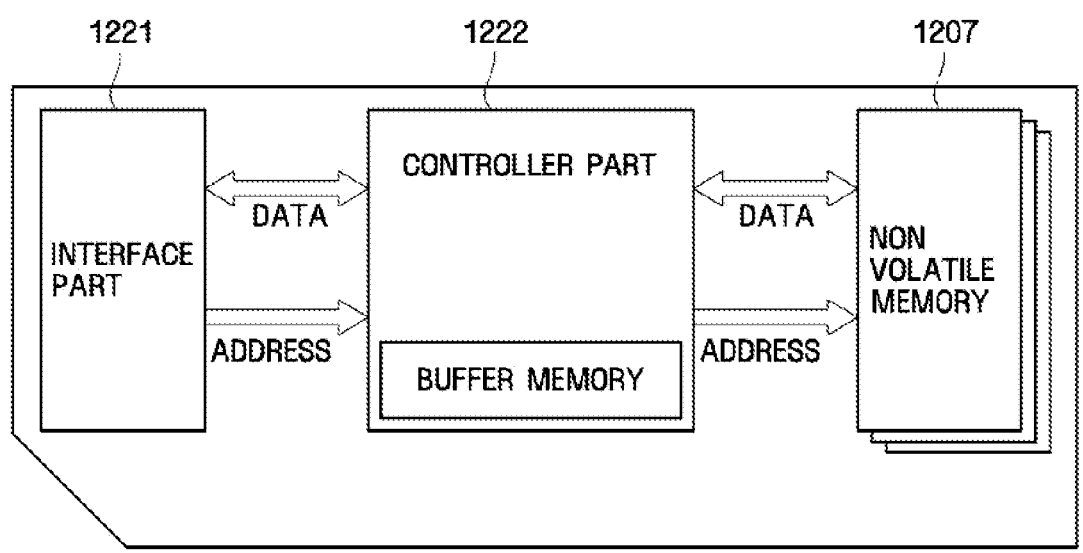

FIG. 14 is an exemplary diagram of a memory card using a nonvolatile memory device according to the embodiments of the inventive concept. The memory card may be, for example, an MMC card, an SD card, a multiuse card, a micro SD card, a memory stick, a compact SD card, an ID card, a PCMCIA card, a SSD card, a chip card, a smart card, or a USB card.

Referring to FIG. 14, the memory card may include at least one of an interface part 1221 performing an interface with an outside, a controller 1222 having a buffer memory and controlling the operation of the memory card, and a nonvolatile memory device according to the embodiments of the inventive concept. The controller 1222 is a processor which can control write and read operations of the nonvolatile memory device 1207. Specifically, the controller 1222 is coupled to the nonvolatile memory device 1207 and the interface part 1221 through a data bus DATA and an address bus ADDRESS.

Figure 15:
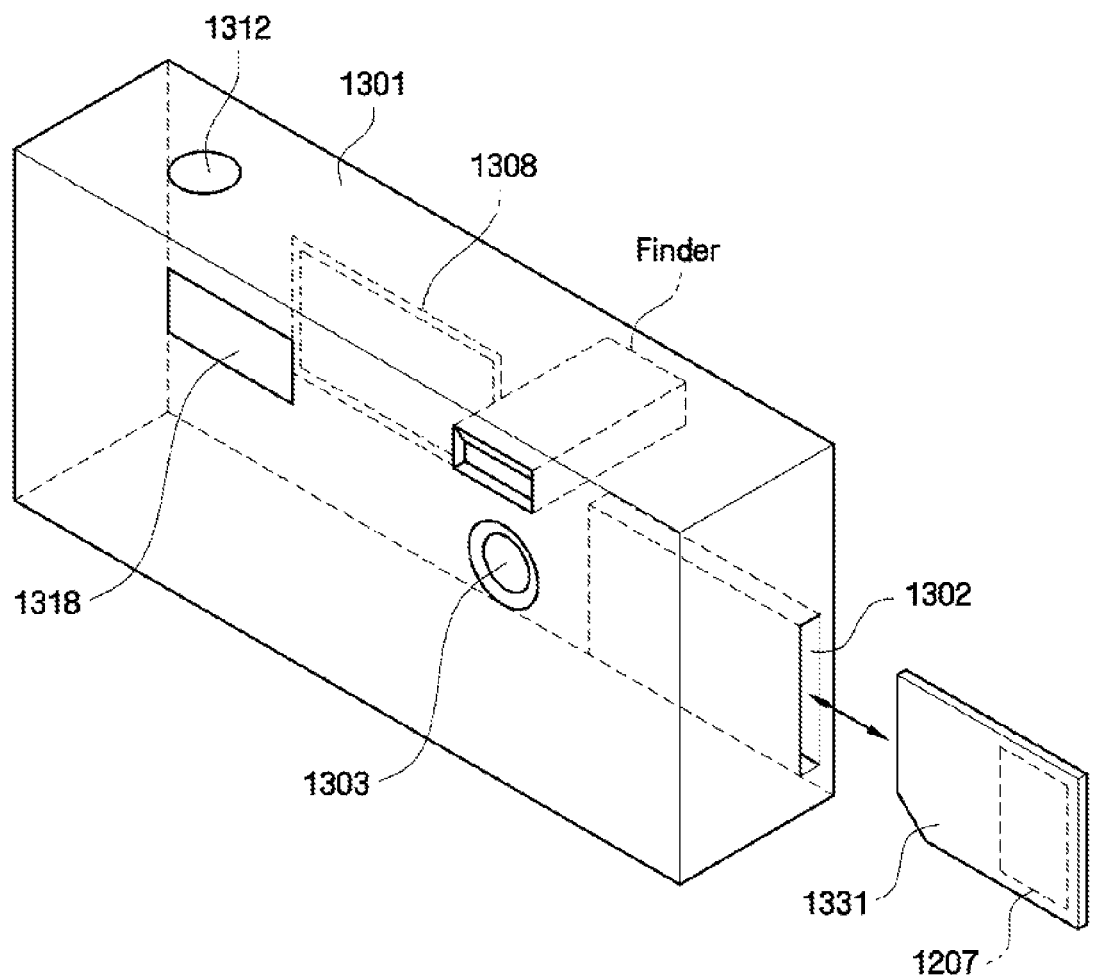

FIG. 15 is an exemplary view of a digital still camera using a nonvolatile memory device according to the embodiments of the inventive concept.

Referring to FIG. 15, the digital still camera includes a body 1301, a slot 1302, a lens 303, a display unit 1308, a shutter button 1312, and a strobe 1318. In particular, a memory card 1331 may be inserted into the slot 1308, and the memory card 1331 may include at least one nonvolatile memory device 1207 according to embodiments of the inventive concept.

If the memory card 1331 is of a contact type, the memory card 1331 comes in electrical contact with a specific electrical circuit on a circuit board when the memory card 1331 is inserted into the slot 1308. If the memory card 1331 is of a non-contact type, the memory card 1331 performs communications through a wireless signal.

Figure 16:
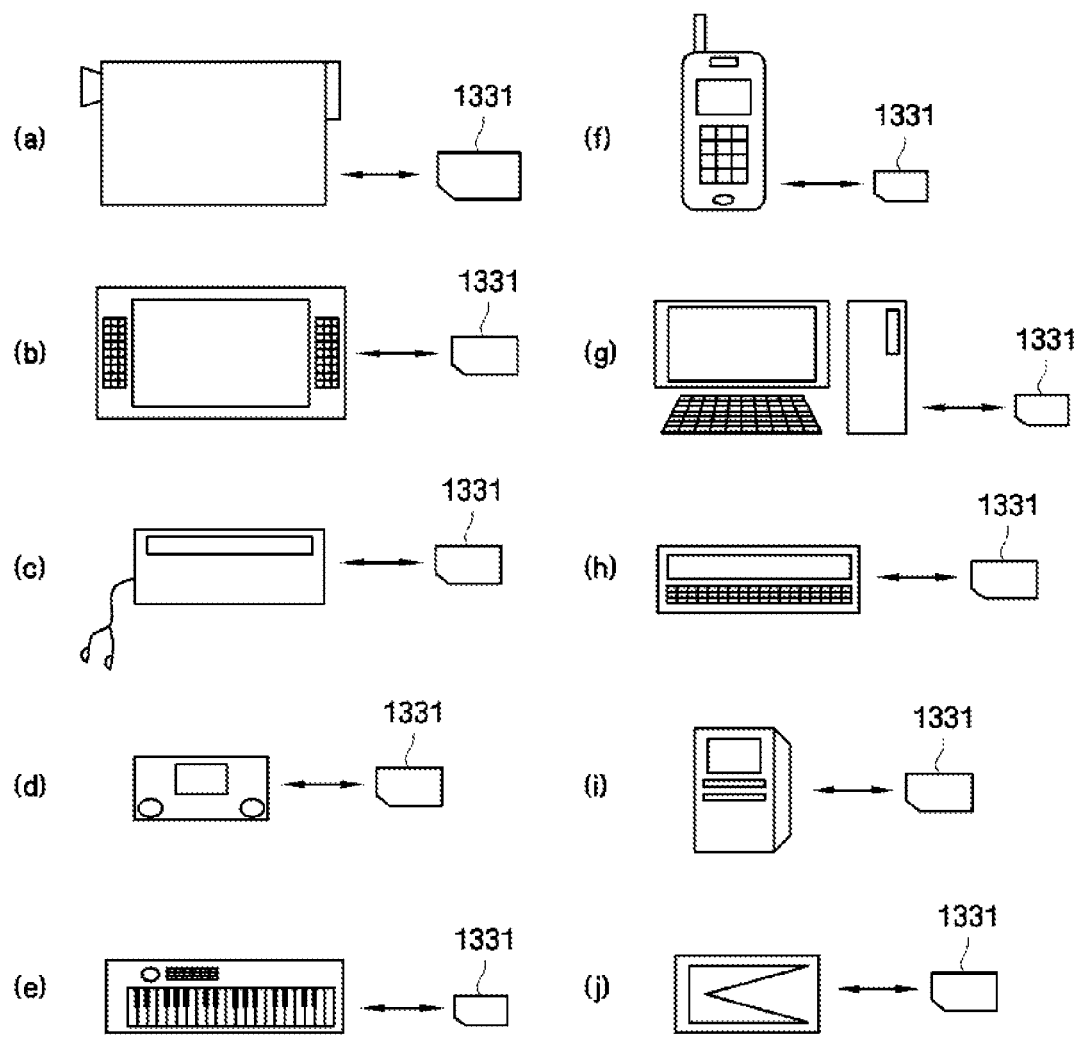

FIG. 16 is an exemplary view explaining various systems using the memory card of FIG. 14.

Referring to FIG. 16, the memory card 1331 may be used in (a) a video camera, (b) a television receiver, (c) an audio device, (d) a game machine, (e) an electronic music device, (f) a cellular phone, (g) a computer, (h) a PDA (Personal Digital Assistant), (i) a voice recorder, or (j) a PC card.

Figure 17:
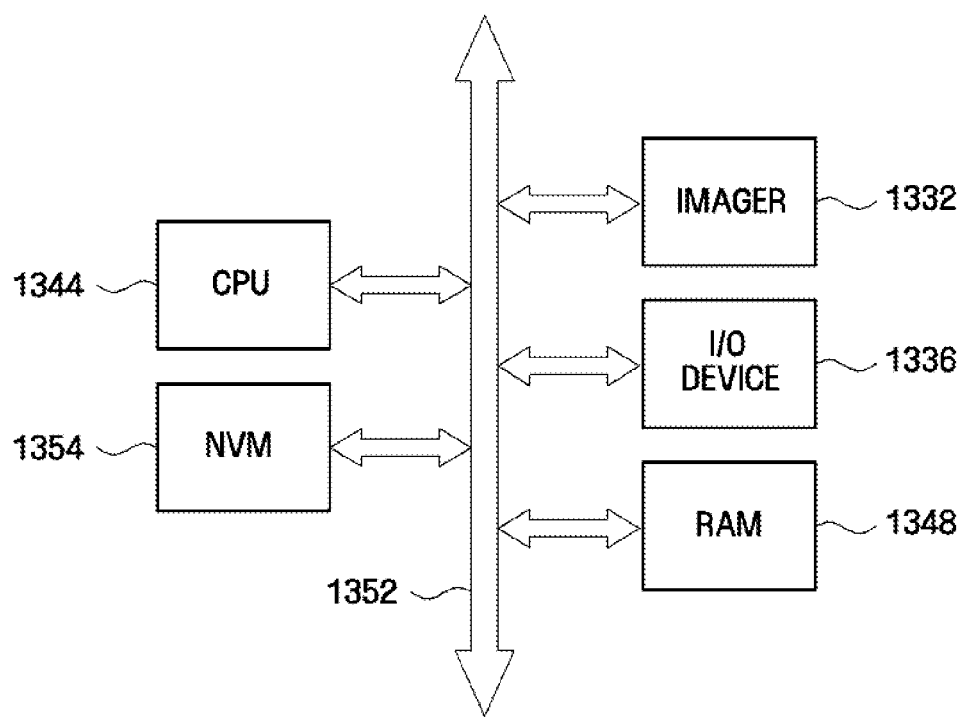

FIG. 17 is an exemplary diagram of an image sensor system using a nonvolatile memory device according to embodiments of the inventive concept.

Referring to FIG. 17, an image sensor system may include an image sensor 1332, an input/output device 1336, a RAM 1348, a CPU 1344, and a nonvolatile memory device 1354 according to embodiments of the inventive concept. The respective constituent elements, that is, the image sensor 1332, the input/output device 1336, the RAM 1348, the CPU 1344, and the nonvolatile memory device 1354 communicate with each other through a bus 1352. The image sensor 1332 may include a photo sensing element, such as a photo gate and a photodiode. The respective constituent elements may be constructed into one chip together with a processor, or may be constructed as a separate chip from the processor.

Figure 18:
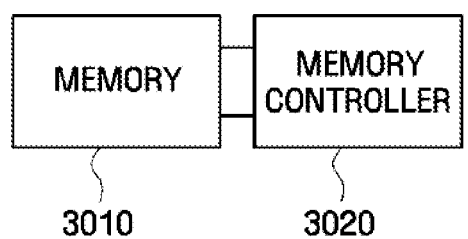

FIG. 18 is an exemplary block diagram of a memory system using a nonvolatile memory device according to embodiments of the inventive concept.

As illustrated, a memory 3010 is coupled to a memory controller 3020. The memory 3010 may be any one according to the above-described embodiments. The memory controller 3020 provides an input signal for controlling the operation of the memory 3010. For example, the memory controller 3020 may send a command and an address signal. The memory controller 3020 may include a memory interface, a host interface, an ECC circuit, a CPU (Central Processing Unit), and a buffer memory. The memory interface may transmit data from the buffer memory to the memory 3010, and may read the data from the memory 3010 and transmit the data to the buffer memory. Further, the memory interface may transmit the command or the address from an external host to the memory 3010.

The host interface may communicate with the external host through a USB (Universal Serial Bus), an SCSI (Small Computer System Interface), a PCI express, an ATA, a PATA (Parallel ATA), a SATA (Serial ATA), or a SAS (Serial Attached SCSI).

The memory system according to embodiments of the inventive concept may have an ECC circuit. The ECC circuit may generate a parity bit using the data transmitted to the memory 3010. The generated parity bit may be stored in a specific region of the memory 3010 together with the data. The ECC circuit senses an error of the data that is read from the memory 3010. If the sensed error is correctable, the ECC circuit corrects the data.

The CPU controls the external host or the memory 3010 through the host interface or the memory interface. The CPU may control write, read, and erase operations in accordance with firmware.

The buffer memory temporarily store write data provided from the external source or data read from the memory 3010. Further, the buffer memory may store metadata or cache data to be stored in the memory 3010. During a sudden power-off operation, the metadata or the cache data stored in the buffer memory may be stored in the memory 3010. The buffer memory may be a DRAM or an SRAM.

Figure 19:
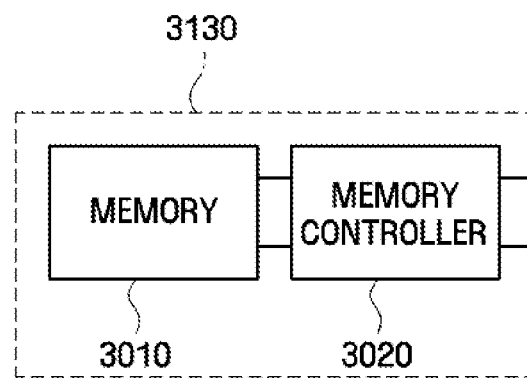

FIG. 19 is another exemplary block diagram of a memory system using a nonvolatile memory device according to embodiments of the inventive concept. A memory system of FIG. 19 is substantially the same as the memory system of FIG. 18. A different point is that the memory 3010 and the memory controller 3020 are embedded in a card 3130. For example, the card 3130 may be a flash memory card. That is, the card 3130 may be standard product that is used in a consumer electronic appliance, such as a digital camera and a personal computer. The memory controller 3020 may control the memory 3010 in accordance with a control signal provided from another device (external device).

Figure 20:
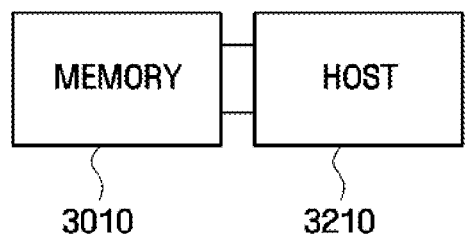

FIG. 20 is still another exemplary block diagram of a memory system using a nonvolatile memory device according to embodiments of the inventive concept. As illustrated, a memory 3010 may be coupled to a host system 3210. The host system 3210 may use the memory 3010 as an erasable storage device. As described above, the host system 3210 may provide an input signal for controlling the memory 3010. For example, the host system 3210 may provide a command CMD and an address signal.

Figure 21:
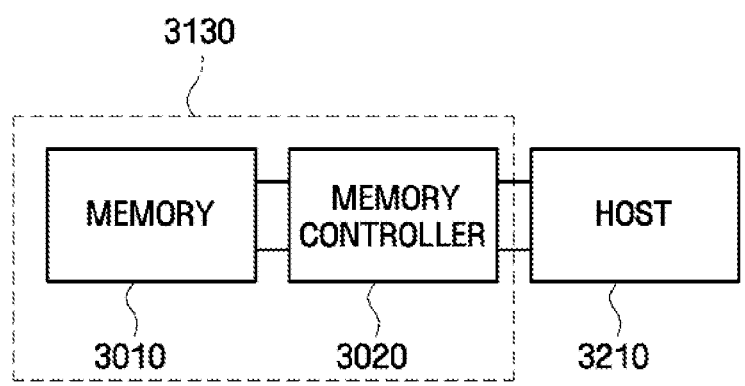

FIG. 21 is still another exemplary block diagram of a memory system using a nonvolatile memory device according to embodiments of the inventive concept. A host system 3210 and a card 3130 are coupled to each other. The host system 3210 provides a control signal to the card 3130, and the memory controller 3020 controls the memory 3010.

Figure 22:
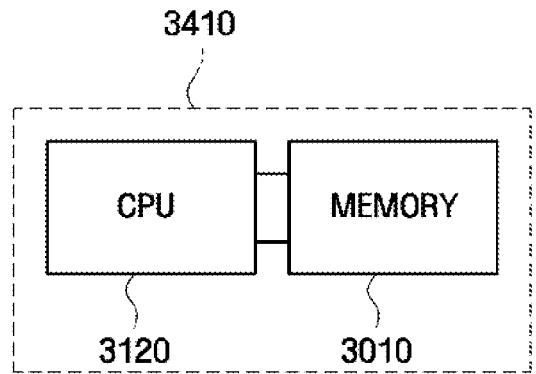

FIG. 22 is still another exemplary block diagram of a memory system using a nonvolatile memory device according to embodiments of the inventive concept. A memory 3010 is provided in a CPU 3120 of a computer system 3410. For example, the computer system 3410 may be a personal computer or a PDA. The memory 3010 may be directly connected to the CPU 3120 through a bus.

The nonvolatile memory device according to embodiments of the inventive concept may be used as an SCM (Storage Class Memory). The SCM means a general memory concept having both nonvolatile characteristics and access characteristics. The SCM may be used as a data storage region and a program operating region.

The nonvolatile memory device using a resistance material, such as the PRAM, the RRAM, and the MRAM as described above, may be used as the SCM. The SCM may be used as a data storage memory in place of a flash memory, or may be used as a main memory in place of an SRAM. One SCM can substitute for a flash memory and an SRAM.

Figure 23:
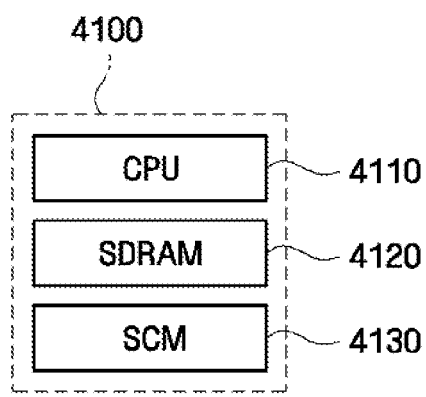

FIG. 23 is an exemplary block diagram illustrating a memory system using SCM. A memory system 4100 includes a CPU 4110, an SDRAM 4120, and an SCM 4130 used in place of a flash memory.

In the memory system 4100, a data access speed of the SCM 4130 is higher than the speed of the flash memory. For example, in a PC environment, when the CPU 4110 operates at 4 GHz, the access speed of the PRAM that is a kind of SCM is 32 times higher than the access speed of the flash memory. Accordingly, the memory system 4100 can obtain a higher-speed access gain than the memory system mounted with the flash memory.

Figure 24:
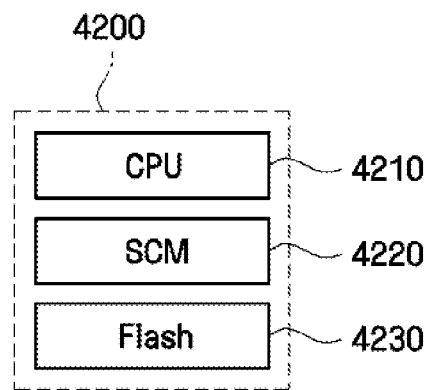

FIG. 24 is another exemplary block diagram illustrating a memory system using SCM. A memory system 4200 includes a CPU 4210, an SCM 4220 used in place of an SDRAM, and a flash memory 4230.

In the memory system 4200, the SCM 4220 uses less power than the SDRAM. Energy used by a main memory of a computer system is about 40% of energy used by the whole system. Accordingly, many persons make efforts to reduce the energy used in the main memory. The SCM can reduce, on an average, about 53% of dynamic energy use, and can reduce, on an average, about 73% of energy use due to leakage power. As a result, the memory system 4200 can reduce more energy than the memory system mounted with the SDRAM.

Figure 25:
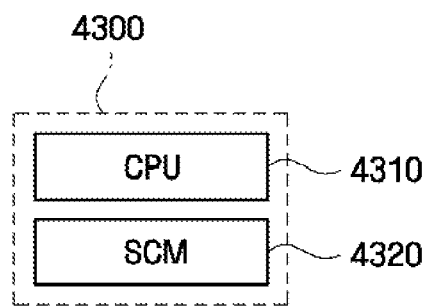

FIG. 25 is still another exemplary block diagram illustrating a memory system using SCM. A memory system 4300 includes a CPU 4310 and an SCM 4320 used in place of an SDRAM and a flash memory. The SCM 4320 is used as a main memory in place of the SDRAM, and is used as a data storage memory in place of the flash memory. The memory system 4300 has advantages in data access speed, low power, space utilization, and cost.

Although preferred embodiments of the inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A method for driving a nonvolatile memory device, comprising:
    determining a read voltage of a nonvolatile memory cell, the read voltage being determined such that a resultant sensing margin is equal to or higher than a predetermined level; and
    adjusting at least one of clamping voltage and a line resistor connected to the nonvolatile memory cell so that the determined read voltage is applied to the nonvolatile memory cell when reading a data stored in the nonvolatile memory cell.

2. The method for driving a nonvolatile memory device of claim 1, wherein adjusting the clamping voltage includes adjusting the clamping voltage in accordance with a position of the nonvolatile memory cell, and
    wherein adjusting the line resistor includes adjusting the line resistor in accordance with the position of the nonvolatile memory cell.

3. The method for driving a nonvolatile memory device of claim 2, wherein the clamping voltage is adjusted, and wherein adjusting the clamping voltage comprises adjusting a level of a control voltage that is applied to a clamping transistor in accordance with the position of the nonvolatile memory cell.

4. The method for driving a nonvolatile memory device of claim 2, wherein the clamping voltage is adjusted, and wherein adjusting the clamping voltage comprises applying a control voltage of a predetermined level to a clamping transistor and adjusting a threshold voltage of the clamping transistor in accordance with the position of the nonvolatile memory cell.

5. The method for driving a nonvolatile memory device of claim 2, wherein the line resistor is adjusted, and wherein adjusting the line resistor comprises adjusting a resistance value of a variable resistor in accordance with the position of the nonvolatile memory cell.

6. The method for driving a nonvolatile memory device of claim 2, wherein the line resistor is adjusted, and wherein adjusting the line resistor comprises turning on selected transistors included in a transistor stack in accordance with the position of the nonvolatile memory cell.

7. The method for driving a nonvolatile memory device of claim 1, wherein the read voltage is determined as an optimum voltage for realizing a maximum sensing margin.

8. The method for driving a nonvolatile memory device of claim 1, wherein the nonvolatile memory cell utilizes a resistance material to store the data.

9. The method for driving a nonvolatile memory device of claim 8, wherein the nonvolatile memory cell is at least one of a PRAM (Phase change Random Access Memory) cell and an RRAM (Resistive Random Access Memory) cell.

10. A method for driving a nonvolatile memory device, the nonvolatile memory device including a memory cell array composed of resistance memory cells, comprising:
electrically connecting a clamping circuit, a line resistor and a selected one of the resistance memory cells in series between a sensing node and a ground;
adjusting at least one of a clamping voltage of the clamping circuit and a resistance of the line resistor according to a relative location of the selected one of the resistance memory cells within the memory cell array; and
applying a read current to the sense node and sensing a voltage of the sense node to read a data stored in the selected one of the resistance memory cells.

11. The method for driving a nonvolatile memory device of claim 10, wherein the clamping voltage is adjusted and the clamping circuit includes a clamping transistor, and wherein adjusting the clamping voltage comprises adjusting a level of a control voltage that is applied to a clamping transistor.

12. The method for driving a nonvolatile memory device of claim 10, wherein the clamping voltage is adjusted and the clamping circuit includes a clamping transistor, and wherein adjusting the clamping voltage comprises applying a control voltage of a predetermined level to the clamping transistor and adjusting a threshold voltage of the clamping transistor.

13. The method for driving a nonvolatile memory device of claim 10, wherein the line resistor is adjusted and the line resistance includes a variable resistor, and wherein adjusting the resistance of the line resistor comprises adjusting a resistance of the variable resistor.

14. The method for driving a nonvolatile memory device of claim 10, wherein the line resistor is adjusted and the line resistor includes a transistor stack, and wherein adjusting the resistance of the line resistor comprises turning on selected transistors included in a transistor stack.

15. A nonvolatile memory device comprising:
a resistance memory cell;
a current source providing a compensation current to a first sensing node;
a sense amplifier connected to the first sensing node to sense a level change of the first sensing node;
a clamping unit connected between the resistance memory cell and the first sensing node to receive a control voltage and to output a clamping voltage; and
a line resistor located between the clamping unit and the resistance memory cell and between the resistance memory cell and a ground terminal,
wherein at least one of the clamping voltage and the line resistor is adjustable so that a read voltage is obtained that results in a sensing margin that is equal to or higher than a predetermined level when reading a data stored in the resistance memory cell.

16. The nonvolatile memory device of claim 15, further comprising a keeper transistor connected to the first sensing node,
wherein the at least one of the clamping voltage and the line resistor are adjusted before the keeper transistor is turned off.

17. The nonvolatile memory device of claim 15, further comprising a second sensing node arranged between the clamping unit and the line resistor,
wherein the clamping voltage is applied to the second sensing node, and
a voltage, which is obtained by dropping the clamping voltage by a resistance of the line resistor, is applied to the resistance memory cell.

18. The nonvolatile memory device of claim 17, wherein the clamping voltage is adjusted by adjusting a level of the control voltage that is applied to a clamping transistor included in the clamping unit in accordance with a position of the resistance memory cell.

19. The nonvolatile memory device of claim 17, wherein the line resistor includes a variable resistor and a parasitic resistor, and
the line resistor is adjusted by adjusting a resistance value of the variable resistor in accordance with a position of the resistance memory cell.

20. The nonvolatile memory device of claim 17, wherein the line resistor includes a transistor stack and a parasitic resistor, and
the line resistor is adjusted by turning on selected transistors included in the transistor stack in accordance with a position of the resistance memory cell.

* * * * *